(12) United States Patent
Viberg et al.

(10) Patent No.: US 11,435,248 B2
(45) Date of Patent: Sep. 6, 2022

(54) RESISTANCE MEASUREMENT ARRAY

(71) Applicant: ORPYX MEDICAL TECHNOLOGIES INC., Calgary (CA)

(72) Inventors: David Allan Viberg, Calgary (CA); Michael Todd Purdy, Calgary (CA); Travis Michael Stevens, Calgary (CA)

(73) Assignee: ORPYX MEDICAL TECHNOLOGIES INC., Calgary (CA)

( * ) Notice: Subject to any disclaimer, the term of this patent is extended or adjusted under 35 U.S.C. 154(b) by 163 days.

(21) Appl. No.: 16/969,582

(22) PCT Filed: Feb. 26, 2019

(86) PCT No.: PCT/CA2019/050229
§ 371 (c)(1),
(2) Date: Aug. 13, 2020

(87) PCT Pub. No.: WO2019/161511
PCT Pub. Date: Aug. 29, 2019

(65) Prior Publication Data
US 2021/0010888 A1 Jan. 14, 2021

Related U.S. Application Data

(60) Provisional application No. 62/635,301, filed on Feb. 26, 2018.

(51) Int. Cl.
| | |
|---|---|
| *G01L 9/02* | (2006.01) |
| *G01L 1/20* | (2006.01) |
| *G01R 27/04* | (2006.01) |

(52) U.S. Cl.
CPC .............. *G01L 9/02* (2013.01); *G01L 1/20* (2013.01); *G01R 27/04* (2013.01)

(58) Field of Classification Search
CPC .............. G01L 9/02; G01L 1/20; G01R 27/04
See application file for complete search history.

(56) References Cited

U.S. PATENT DOCUMENTS 10,430,493 B1 * 10/2019 Kendall ............ G11C 13/0028
11,200,948 B1 * 12/2021 Ambrosi ............ G11C 13/004
(Continued)

FOREIGN PATENT DOCUMENTS

| CN | 103925934 B | 3/2016 |
| CN | 106370212 A | 2/2017 |

(Continued)

OTHER PUBLICATIONS

International Search Report, Written Opinion of the International Searching Authority, and Search Strategy of parent application No. PCT/CA2019/050229.

*Primary Examiner* — Max H Noori
(74) *Attorney, Agent, or Firm* — ABM Intellectual Property Inc.; Adrienne Bieber McNeil

(57) ABSTRACT

A system and method for measuring resistance over an array. The array includes at least three electrodes. Nodes at each intersection between input electrodes and output electrodes have variable resistance. A driving voltage is applied to a selected input electrode and an output current is received at a selected output electrode. A selected node is at the intersection of the two selected electrodes and includes an electrical component with a resistive property. Remaining electrodes are connected with a ground for isolating the selected node from the effects of changes in impedance of the remaining nodes. The driving voltage is converted to an output current by resistance at the selected node. The output current is converted to an output voltage with a current-to-voltage converter circuit for measuring the resistance of the (Continued)

electrical component. The nodes may be measured as the selected node in sequential or non-sequential patterns.

18 Claims, 3 Drawing Sheets

(56) References Cited

U.S. PATENT DOCUMENTS

| | | | | |
|---|---|---|---|---|
| 11,281,330 | B2* | 3/2022 | Rosenberg | G06F 3/041661 |
| 2007/0080910 | A1* | 4/2007 | Park | G09G 3/3208 |
| | | | | 345/77 |
| 2018/0114569 | A1* | 4/2018 | Strachan | G06N 3/0635 |
| 2020/0218967 | A1* | 7/2020 | Strachan | G06N 3/08 |
| 2020/0334523 | A1* | 10/2020 | Kumar | G06N 3/0635 |
| 2020/0356843 | A1* | 11/2020 | Strachan | G06N 3/08 |
| 2021/0344341 | A1* | 11/2021 | Okuda | H01L 29/7813 |

FOREIGN PATENT DOCUMENTS

| | | |
|---|---|---|
| CN | 106500736 A | 3/2017 |
| CN | 106500847 A | 3/2017 |
| CN | 106597110 A | 4/2017 |
| CN | 106597111 A | 4/2017 |
| CN | 106841812 A | 6/2017 |

* cited by examiner

RESISTANCE MEASUREMENT ARRAY

CROSS-REFERENCE TO RELATED APPLICATIONS

This application is a national stage entry of International Patent Application No. PCT/CA2019/050229, filed Feb. 26, 2019 and entitled "RESISTANCE MEASUREMENT ARRAY", which claims the benefit of priority of U.S. Provisional Patent Application No. 62/635,301, filed Feb. 26, 2018 and entitled "RESISTIVE PRESSURE MEASUREMENT SENSORY ARRAY", both of which are incorporated herein by reference in their entirety.

FIELD

The present disclosure relates to measurement of resistance in resistive arrays.

BACKGROUND

Pressure measurement and other sensor arrays are commonly used in many fields including weight detection in vehicle seats and pressure distribution measurements in hospital beds. Devices used in these applications range in temporal and spatial resolution. Existing technologies may feature high frequency scanning, but quickly become expensive with ever-increasing circuit complexity.

Ideal designs feature both high spatial density of pressure-sensing areas (sensors) and a high scanning frequency. High spatial density, high scanning frequency sensor arrays may come in the form of a grid of capacitive, resistive, or piezoelectric pressure-sensitive areas or sensors, each of which are intersected by two electrodes. One of the electrodes is connected to a signal source (the input electrode), while the other is connected to an output circuit (the output electrode). This formation is repeated for each sensor in an array, and any one electrode may be connected to a multitude of sensors, creating a grid of sensors that is each found at the intersecting point of an input and an output electrode. By applying a signal to one of the input electrodes connected to the source, and reading the signal from one of the output electrodes, the electrical characteristics at the individual sensor isolated at the intersection of the two electrodes, can be determined. Calibration of the system allows for these electrical characteristics to be translated into corresponding pressure readings, and continual scanning across each of the sensors can be used to measure the pressure distribution across an entire area over time.

Application of the signal to only one of the multiple input electrodes and election of only one of the multiple output electrodes for reading is multiplexing, and allows the isolation of one single sensor within the sensor array. The circuit scans through each of the sensors, measuring the pressure at each in a moment before moving to the next.

Some previous technologies are directed to increasing spatial resolution of the sensor array. In some approaches, a comparator amplifier is implemented at an output electrode with a threshold voltage. Only signals coming from the sensor array that are above this predetermined threshold pass through to the control circuit and subsequent output. Thus, low pressures (and resulting low signals) are ignored. However, in applications where pressure resolution is the focus, this process removes relevant data.

Another focus is on scanning frequency. Discharging resistances along every input electrode may discharge trace capacitances in unselected electrode lines. This method allows for an increase in discharging speed and results in higher possible scanning frequencies, but introduces an error in the resistance reading (and subsequent interpretation of the applied pressure) at every sensor point, thus reducing the resolution and precision of the pressure measurement.

Accommodation of large pressure ranges is another area of focus in existing technologies, and is sometimes accomplished by creating a control circuit that monitors output readings and adjusts the driving voltage accordingly. This approach may increase circuit complexity and manufacturing costs.

SUMMARY

It is an object of the present disclosure to obviate or mitigate at least one disadvantage of previous resistance measurement arrays. Aspects of the present disclosure relate to a system including a circuit and an accompanying method to measure resistance. The resistance is measured over an array of nodal intersection points between input electrodes and output electrodes. The system and method facilitate increased resolution on measurement of resistance over an array. The system and method may be applied to measurement of resistance over an array for sensing pressure distribution across a surface.

The circuit may include an array of variable-resistance areas. Each variable-resistance area is defined by a node between an input electrode and an output electrode. The circuit includes at least one of the input electrodes, at least one of the output electrodes, and at least one additional input or output electrode, providing at least two nodes. Each of the input and output electrodes may intersect a multitude of variable-resistance areas, defining a multitude of nodes. The resistance of the circuit may be sensitive to changes in applied pressure or other environmental property at the node. A driving voltage is applied to one of the input electrodes. The driving voltage passes through the node, changing the current of the driving voltage. An output current is received at one of the number of output electrodes, isolating an individual node at the intersection of the two electrodes. The output current is converted to an output voltage by a transimpedance amplifier, an integrator and control circuit or other current-to-voltage converter circuit. The output voltage is dependent on the resistance at the isolated node and the driving voltage. In some applications of the system and method, the resistance may be dependent on pressure or another environmental property applied at or to the node, facilitating measurement of applied pressure or other environmental properties at the location of each node. In some applications of the system and method, an onboard calibrator may be used to calibrate the system against known resistance values to account for gain of the system. The known resistance values may include an open node with essentially infinite resistance and a resistor or other electrical component having a resistive property, with a known resistance value.

Where the circuit includes two or more input electrodes, the driving voltage is applied to an individual input electrode through an input multiplexor, which selects only one of the multitude of input electrodes to which to apply the driving voltage. Where the circuit includes two or more output electrodes, the output current is received at one of the output electrodes by selecting the output electrode with an output multiplexor. This way, only one node both receives the signal and is measured, at the intersection of the selected input electrode and the selected output electrode. All unselected electrodes are connected directly to a ground through single-pole double-throw switches.

Since individual input electrodes and output electrodes may be connected to a multitude of nodes, the electrical characteristics such as the resistance and capacitance of each variable-resistance area in line with the selected input electrode and the selected output electrode may affect the output current and the output voltage converted from the output current. To mitigate the effects that these remaining nodes have on the output current and associated measurement error, variations in the remaining nodes are isolated from the output voltage by connecting the remaining nodes directly to the ground. The output current is sent to a single transimpedance amplifier, an integrator and control circuit, or other current-to-voltage converter for converting the output current to the output voltage. The output voltage can then be converted by an analog-to-digital converter to a value that can be visualized or otherwise processed.

In a first aspect, herein provided is a system and method for measuring resistance over an array. The array includes at least three electrodes. Nodes at each intersection between input electrodes and output electrodes have variable resistance. A driving voltage is applied to a selected input electrode and an output current is received at a selected output electrode. A selected node is at the intersection of the two selected electrodes and includes an electrical component with a resistive property. Remaining electrodes are connected with a ground for isolating the selected node from the effects of changes in impedance of the remaining nodes. The driving voltage is converted to an output current by resistance at the selected node. The output current is converted to an output voltage with a current-to-voltage converter circuit for measuring the resistance of the electrical component. The nodes may be measured as the selected node in sequential or non-sequential patterns.

In a further aspect, herein provided is a method of measuring resistance comprising: providing an array of two or more nodes, each of the nodes defined at an intersection of an input electrode and an output electrode; selecting a selected node at an intersection of a selected input electrode and a selected output electrode, the selected node comprising an electrical component having a resistive property; grounding remaining input electrodes other than the selected input electrode; grounding remaining output electrodes other than the selected output electrode; applying a driving voltage to the selected input electrode; converting the driving voltage to an output current through a resistance of the electrical component; receiving the output current at the selected output electrode; and converting the output current to an output voltage for measuring the resistance of the electrical component.

In some embodiments, the two or more nodes comprise an open node. In some embodiments, selecting the selected node is applied sequentially or non-sequentially to each of the two or more nodes. In some embodiments, selecting the selected node comprises selecting the selected input electrode. In some embodiments, grounding the remaining input electrodes comprises establishing electrical communication between the remaining input electrodes and a true ground, a positive virtual input ground or a stable fixed voltage. In some embodiments, grounding the remaining output electrodes comprises establishing electrical communication between the remaining output electrodes and a true ground, a positive virtual input ground or a stable fixed voltage. In some embodiments, grounding the remaining input electrodes and the remaining output electrodes comprises establishing electrical communication between the remaining input electrodes, the remaining output electrodes and a single shared true ground, a single shared positive virtual input ground or a single shared stable fixed voltage. In some embodiments, converting the output current to an output voltage comprises application of a transimpedance amplifier to the output current. In some embodiments, converting the output current to an output voltage comprises application of an integration and control circuit to the output current. In some embodiments, the resistance of the electrical component is variable and dependent on a first property of an environment around the electrical component, and the method further comprises determining a value of the first property at the selected node with reference to the resistance of the electrical component. In some embodiments, the first property and the second property are each selected from pressure, stress, shear, strain, biometrics, temperature, sound intensity or quality, light intensity or quality, electromagnetic fields, humidity, moisture, voltage, current, heart rate or other organ function, atrial fibrillation, breathing or physical movement. In some embodiments, the method includes lowering an equivalent resistance of the selected node for linearizing the output voltage. In some embodiments, the method includes calibrating the array against a pair of calibration nodes comprising an open node and a known resistance node to calculate the gain of the array.

In a further aspect, herein provided is a system for measuring resistance, the system comprising: at least three electrodes arranged in an array, the electrodes comprising at least one input electrode and at least one output electrode, and the array comprising at least two nodes, each node being defined at an intersection between an input electrode and an output electrode; a driving voltage source in electrical communication with the input electrode for providing a driving voltage to a selected node defined at an intersection between a selected input electrode and a selected output electrode, the selected node comprising an electrical component having a resistive property; a switching system in operative communication with the electrodes for selecting the selected node; a current-to-voltage converter circuit in electrical communication with the output electrode for receiving an output current from the selected node and converting the output current to an output voltage; and a ground in communication with the array for grounding remaining input electrodes other than the selected input electrode, and for grounding remaining output electrodes other than the selected output electrode, for isolating the selected node from electrical effects on the array other than at the selected node.

In some embodiments, the electrodes comprise at least two input electrodes; the switching system is in operative communication with the at least two input electrodes; and the system further comprises an input multiplexor in communication with the input electrodes for establishing electrical communication between the selected input electrode and the driving signal source, and between the remaining input electrodes and the ground. In some embodiments, the at least three electrodes comprise at least two output electrodes; the switching system is in operative communication with the at least two output electrodes; and the system further comprises an output multiplexor in communication with the output electrodes for establishing electrical communication between the selected output electrode and the current-to-voltage converter circuit, and between the remaining output electrodes and the ground. In some embodiments, the switching system comprises a single-pole double-throw switch. In some embodiments, the at least two nodes comprise at least three nodes, and the nodes are arranged orthogonally or non-orthogonally with respect to one another. In some embodiments, a resistance at the selected node is variable and dependent on a first property of an environment around the array. In some embodiments, the resistance at the selected node is variable and dependent on a second property of the environment. In some embodiments, the first property and the second property are each selected from the properties consisting of pressure, stress, shear, strain, biometrics, temperature, sound intensity or quality, light intensity or quality, electromagnetic fields, humidity, moisture, voltage, current, heart rate or other organ function, atrial fibrillation, breathing or physical movement. In some embodiments, the system includes an analog-to-digital converter in electronic communication with the current-to-voltage converter circuit for receiving the output voltage and converting the output voltage to a digital signal; and a processor in electronic communication with the analog-to-digital converter and configured for receiving the digital signal, processing the digital signal; and communicating the property or the second property to a user of the system. In some embodiments, the at least two nodes comprise an open node. In some embodiments, the driving voltage source comprises a DC voltage source. In some embodiments, the current-to-voltage converter circuit comprises a transimpedance amplifier. In some embodiments, the current-to-voltage converter circuit comprises an integrator and control circuit. In some embodiments, the ground comprises a true ground, a virtual ground or a stable fixed voltage. In some embodiments, the system includes an analog-to-digital converter in electronic communication with the current-to-voltage converter circuit for receiving the output voltage and converting the output voltage to a digital signal. In some embodiments, the system includes a processor in electronic communication with the analog-to-digital converter for receiving the digital signal and processing the digital signal. In some embodiments, the system includes a linearization circuit in electrical communication with the electrodes for lowering the equivalent resistance of the selected node for linearizing the output voltage. In some embodiments, the system includes a calibrator in electrical communication with the electrodes for calibrating the array against a pair of calibration nodes comprising an open node and a known resistance node.

In a further aspect, herein provided is a method of measuring resistance comprising: providing an array of two or more nodes, each of the nodes defined at an intersection of an input electrode and an output electrode; selecting a selected node at an intersection of a selected input electrode and a selected output electrode, the selected node comprising an electrical component having a resistive property; grounding remaining input electrodes other than the selected input electrode; grounding remaining output electrodes other than the selected output electrode; applying a driving voltage to the selected input electrode; converting the driving voltage to an output current through a resistance of the electrical component; receiving the output current at the selected output electrode; and converting the output current to an output voltage with an integration and control circuit for measuring the resistance of the electrical component.

In some embodiments, the two or more nodes comprise an open node. In some embodiments, selecting the selected node is applied sequentially or non-sequentially to each of the two or more nodes. In some embodiments, selecting the selected node comprises selecting the selected input electrode. In some embodiments, grounding the remaining input electrodes comprises establishing electrical communication between the remaining input electrodes and a true ground, a positive virtual input ground or a stable fixed voltage. In some embodiments, grounding the remaining output electrodes comprises establishing electrical communication between the remaining output electrodes and a true ground, a positive virtual input ground or a stable fixed voltage. In some embodiments, grounding the remaining input electrodes and the remaining output electrodes comprises establishing electrical communication between the remaining input electrodes, the remaining output electrodes and a single shared true ground, a single shared positive virtual input ground or a single shared stable fixed voltage. In some embodiments, converting the output current to an output voltage comprises application of a transimpedance amplifier to the output current. In some embodiments, the resistance of the electrical component is variable and dependent on a first property of an environment around the electrical component, and the method further comprises determining a value of the first property at the selected node with reference to the resistance of the electrical component. In some embodiments, the first property and the second property are each selected from pressure, stress, shear, strain, biometrics, temperature, sound intensity or quality, light intensity or quality, electromagnetic fields, humidity, moisture, voltage, current, heart rate or other organ function, atrial fibrillation, breathing or physical movement. In some embodiments, the method includes lowering an equivalent resistance of the selected node for linearizing the output voltage. In some embodiments, the method includes calibrating the array against a pair of calibration nodes comprising an open node and a known resistance node to calculate the gain of the array.

In a further aspect, herein provided is a system for measuring resistance, the system comprising: at least three electrodes arranged in an array, the electrodes comprising at least one input electrode and at least one output electrode, and the array comprising at least two nodes, each node being defined at an intersection between an input electrode and an output electrode; a driving voltage source in electrical communication with the input electrode for providing a driving voltage to a selected node defined at an intersection between a selected input electrode and a selected output electrode, the selected node comprising an electrical component having a resistive property; a switching system in operative communication with the electrodes for selecting the selected node; an integrator and control circuit in electrical communication with the output electrode for receiving an output current from the selected node and converting the output current to an output voltage; and a ground in communication with the array for grounding remaining input electrodes other than the selected input electrode, and for grounding remaining output electrodes other than the selected output electrode, for isolating the selected node from electrical effects on the array other than at the selected node.

In some embodiments, the electrodes comprise at least two input electrodes; the switching system is in operative communication with the at least two input electrodes; and the system further comprises an input multiplexor in communication with the input electrodes for establishing electrical communication between the selected input electrode and the driving signal source, and between the remaining input electrodes and the ground. In some embodiments, the at least three electrodes comprise at least two output electrodes; the switching system is in operative communication with the at least two output electrodes; and the system further comprises an output multiplexor in communication with the output electrodes for establishing electrical communication between the selected output electrode and the current-to-voltage converter circuit, and between the remaining output electrodes and the ground. In some embodiments, the switching system comprises a single-pole double-throw switch. In some embodiments, the at least two nodes comprise at least three nodes, and the nodes are arranged orthogonally or non-orthogonally with respect to one another. In some embodiments, a resistance at the selected node is variable and dependent on a first property of an environment around the array. In some embodiments, the resistance at the selected node is variable and dependent on a second property of the environment. In some embodiments, the first property and the second property are each selected from the properties consisting of pressure, stress, shear, strain, biometrics, temperature, sound intensity or quality, light intensity or quality, electromagnetic fields, humidity, moisture, voltage, current, heart rate or other organ function, atrial fibrillation, breathing or physical movement. In some embodiments, the system includes an analog-to-digital converter in electronic communication with the current-to-voltage converter circuit for receiving the output voltage and converting the output voltage to a digital signal; and a processor in electronic communication with the analog-to-digital converter and configured for receiving the digital signal, processing the digital signal; and communicating the property or the second property to a user of the system. In some embodiments, the at least two nodes comprise an open node. In some embodiments, the driving voltage source comprises a DC voltage source. In some embodiments, the current-to-voltage converter circuit comprises a transimpedance amplifier. In some embodiments, the ground comprises a true ground, a virtual ground or a stable fixed voltage. In some embodiments, the system includes an analog-to-digital converter in electronic communication with the current-to-voltage converter circuit for receiving the output voltage and converting the output voltage to a digital signal. In some embodiments, the system includes a processor in electronic communication with the analog-to-digital converter for receiving the digital signal and processing the digital signal. In some embodiments, the system includes a linearization circuit in electrical communication with the electrodes for lowering the equivalent resistance of the selected node for linearizing the output voltage. In some embodiments, the system includes a calibrator in electrical communication with the electrodes for calibrating the array against a pair of calibration nodes comprising an open node and a known resistance node.

In a further aspect, herein provided is a method of measuring resistance comprising: providing an array of two or more nodes, each of the nodes defined at an intersection of an input electrode and an output electrode; calibrating the array against a pair of calibration nodes comprising an open node and a known resistance node to calculate the gain of the array; selecting a selected node at an intersection of a selected input electrode and a selected output electrode, the selected node comprising an electrical component having a resistive property; grounding remaining input electrodes other than the selected input electrode; grounding remaining output electrodes other than the selected output electrode; applying a driving voltage to the selected input electrode; converting the driving voltage to an output current through a resistance of the electrical component; receiving the output current at the selected output electrode; and converting the output current to an output voltage with a current-to-voltage converter circuit for measuring the resistance of the electrical component.

In some embodiments, the two or more nodes comprise an open node. In some embodiments, selecting the selected node is applied sequentially or non-sequentially to each of the two or more nodes. In some embodiments, selecting the selected node comprises selecting the selected input electrode. In some embodiments, grounding the remaining input electrodes comprises establishing electrical communication between the remaining input electrodes and a true ground, a positive virtual input ground or a stable fixed voltage. In some embodiments, grounding the remaining output electrodes comprises establishing electrical communication between the remaining output electrodes and a true ground, a positive virtual input ground or a stable fixed voltage. In some embodiments, grounding the remaining input electrodes and the remaining output electrodes comprises establishing electrical communication between the remaining input electrodes, the remaining output electrodes and a single shared true ground, a single shared positive virtual input ground or a single shared stable fixed voltage. In some embodiments, converting the output current to an output voltage comprises application of a transimpedance amplifier to the output current. In some embodiments, converting the output current to an output voltage comprises application of an integration and control circuit to the output current. In some embodiments, the resistance of the electrical component is variable and dependent on a first property of an environment around the electrical component, and the method further comprises determining a value of the first property at the selected node with reference to the resistance of the electrical component. In some embodiments, the first property and the second property are each selected from pressure, stress, shear, strain, biometrics, temperature, sound intensity or quality, light intensity or quality, electromagnetic fields, humidity, moisture, voltage, current, heart rate or other organ function, atrial fibrillation, breathing or physical movement.

In a further aspect, herein provided is a system for measuring resistance, the system comprising: at least three electrodes arranged in an array, the electrodes comprising at least one input electrode and at least one output electrode, and the array comprising at least two nodes, each node being defined at an intersection between an input electrode and an output electrode; a calibrator in electrical communication with the electrodes for calibrating the array against a pair of calibration nodes comprising an open node and a known resistance node; a driving voltage source in electrical communication with the input electrode for providing a driving voltage to a selected node defined at an intersection between a selected input electrode and a selected output electrode, the selected node comprising an electrical component having a resistive property; a switching system in operative communication with the electrodes for selecting the selected node; a current-to-voltage converter circuit in electrical communication with the output electrode for receiving an output current from the selected node and converting the output current to an output voltage; and a ground in communication with the array for grounding remaining input electrodes other than the selected input electrode, and for grounding remaining output electrodes other than the selected output electrode, for isolating the selected node from electrical effects on the array other than at the selected node.

In some embodiments, the electrodes comprise at least two input electrodes; the switching system is in operative communication with the at least two input electrodes; and the system further comprises an input multiplexor in communication with the input electrodes for establishing electrical communication between the selected input electrode and the driving signal source, and between the remaining input electrodes and the ground. In some embodiments, the at least three electrodes comprise at least two output electrodes; the switching system is in operative communication with the at least two output electrodes; and the system further comprises an output multiplexor in communication with the output electrodes for establishing electrical communication between the selected output electrode and the current-to-voltage converter circuit, and between the remaining output electrodes and the ground. In some embodiments, the switching system comprises a single-pole double-throw switch. In some embodiments, the at least two nodes comprise at least three nodes, and the nodes are arranged orthogonally or non-orthogonally with respect to one another. In some embodiments, a resistance at the selected node is variable and dependent on a first property of an environment around the array. In some embodiments, the resistance at the selected node is variable and dependent on a second property of the environment. In some embodiments, the first property and the second property are each selected from the properties consisting of pressure, stress, shear, strain, biometrics, temperature, sound intensity or quality, light intensity or quality, electromagnetic fields, humidity, moisture, voltage, current, heart rate or other organ function, atrial fibrillation, breathing or physical movement. In some embodiments, the system includes an analog-to-digital converter in electronic communication with the current-to-voltage converter circuit for receiving the output voltage and converting the output voltage to a digital signal; and a processor in electronic communication with the analog-to-digital converter and configured for receiving the digital signal, processing the digital signal; and communicating the property or the second property to a user of the system. In some embodiments, the at least two nodes comprise an open node. In some embodiments, the driving voltage source comprises a DC voltage source. In some embodiments, the current-to-voltage converter circuit comprises a transimpedance amplifier. In some embodiments, the current-to-voltage converter circuit comprises an integrator and control circuit. In some embodiments, the ground comprises a true ground, a virtual ground or a stable fixed voltage. In some embodiments, the system includes an analog-to-digital converter in electronic communication with the current-to-voltage converter circuit for receiving the output voltage and converting the output voltage to a digital signal. In some embodiments, the system includes a processor in electronic communication with the analog-to-digital converter for receiving the digital signal and processing the digital signal. In some embodiments, the system includes a linearization circuit in electrical communication with the electrodes for lowering the equivalent resistance of the selected node for linearizing the output voltage.

Other aspects and features of the present disclosure will become apparent to those ordinarily skilled in the art upon review of the following description of specific embodiments in conjunction with the accompanying figures.

BRIEF DESCRIPTION OF THE DRAWINGS

Embodiments of the present disclosure will now be described, by way of example only, with reference to the attached figures, in which reference numerals sharing a common final two digits refer to corresponding features across figures (e.g. the selected node 102a, selected node 302a, selected node 402a, selected node 502a, selected node 602a, etc.).

DETAILED DESCRIPTION

Figure 1:
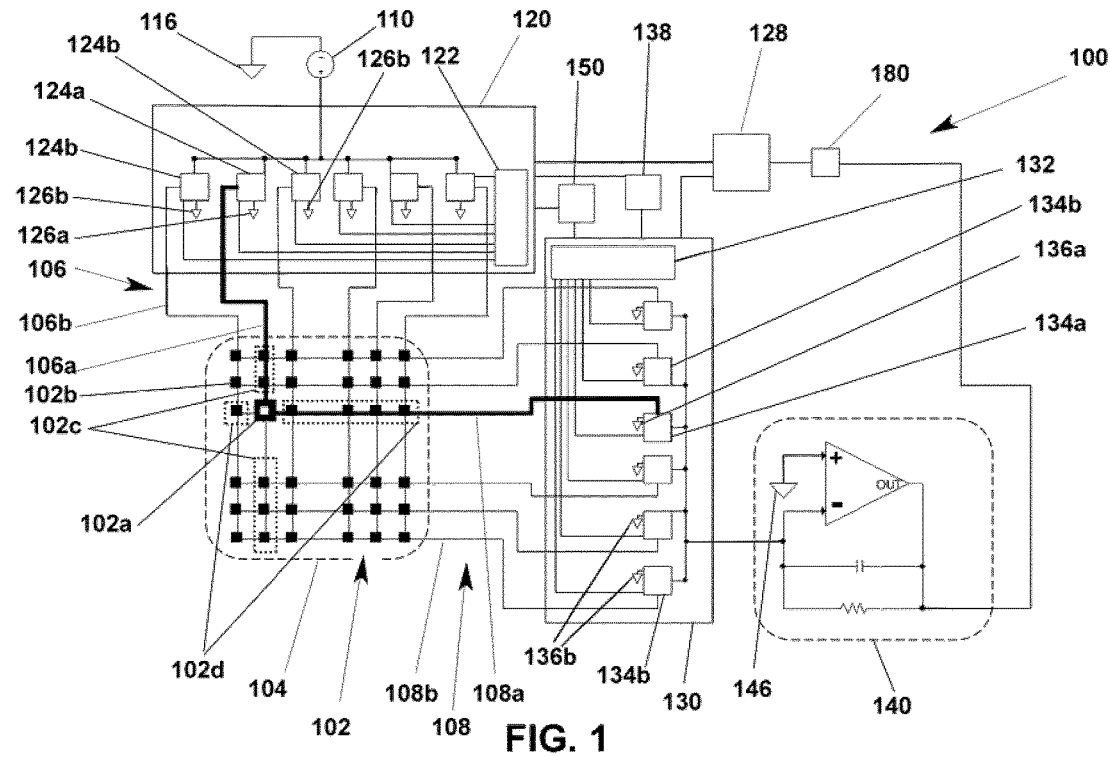
FIG. 1 is a circuit drawing of a resistance measurement array.

Generally, the present disclosure provides a method and system for measuring resistance at a selected node of a resistance measurement array.

A system and method for measuring resistance in a resistance measurement array. At least one input electrode and at least one output electrode, totaling at least three electrodes, define a resistive sensor array. Each intersection between an input electrode and an output electrode defines a node. Each node has an electrical component having a resistive property. A signal source for generating a driving voltage is in electrical communication with the input electrodes. Input switches allow selective application of the driving voltage to a selected input electrode. Output switches allow selective detection of an output voltage at a selected output electrode. Together the input switches and the output switches provide a switching system in operative communication with the input electrodes and the output electrodes for selecting the selected node. The output voltage is converted from an output current, which results from passing the driving voltage through the resistance of the selected node. A transimpedance amplifier, integrator and control circuit or other current-to-voltage converter circuit converts the output current to the output voltage and amplify the output voltage downstream of the output electrode.

Grounds or other reference voltage sources are applied to remaining input electrodes other than the selected input electrode, and to remaining output electrodes other than the selected output electrode, for isolating a selected node from the effects of changes in impedance of nodes other than the selected node. The selected node is at the intersection of the selected input electrode and the selected output electrode. The selected node may be changed by changing the selected input electrode or changing selected output electrode. The output voltage measured as a result of the resistance at the selected node may be communicated to a processor. The processor may calculate a pressure or other environmental property at the selected node based on a variable resistance, which is sensitive to the environmental property, at the selected node.

A node may have no resistance, infinite resistance (i.e. an open node), finite resistance, or may have an electrical component whose reading can be converted to resistance. The electrical component may include a sensor that converts a physical condition or other environmental property at the node into a resistance such as biometric sensors, stress sensors, shear sensors, strain sensors, pressure sensors, thermistors, microphone, acoustic sensors, light intensity sensors, magnetic sensors, humidity sensors, voltage sensors, current sensors, heart rate sensors, breathing rate sensors, atrial fibrillation sensors, activity sensors (step, calorie, activity recognition, sleep quality, walking, running, sitting, standing, slip and fall detection, fatigue detection, ovulation, and blood pressure). Arrays may be homogeneous or heterogeneous arrays of electrical components, and may include sensors for a variety of properties of the environment. More than one type of electrical component or sensor may be located at the nodes of the same array. More than one electrical component or sensor may be located at each node. Groupings of sensors or other electrical components or may occur in regions of a resistive array.

The input electrodes and the output electrodes may be arranged into any suitable pattern to provide the measurement array. Orthogonal relative orientations between the input and output electrodes in rectilinear or other arrangements, or non-orthogonal relative orientations may be used on any given application of the system. Using an example where the input electrodes are in columns and the output electrodes in rows, the driving voltage source may be applied to one column of input electrodes and the unselected columns are grounded to an input ground through use of input switches. One row of output electrodes is correspondingly selected and connected to a transimpedance amplifier, integrator circuit or other current-to-voltage converting electronic circuit, and the unselected output electrode rows are grounded using output switches. The selected input electrode and the selected output electrode intersect at a selected node. Output current results from application of the driving voltage to the selected node. The output current is converted to an output voltage by the transimpedance amplifier, integrator circuit or other current-to-voltage converting electronic circuit. The output voltage is passed to an analog to digital converter or other measuring device. The grounding of the unselected rows and columns isolates the selected node at which resistance is being measured from the effects of the impedance of the nodes other than the selected node.

The input switches and the output switches may include single-pole double-throw switches, which may include low on-resistance single-pole double-throw switches. The single-pole double-throw switches are connected with grounds to mitigate errors regardless of scanning speed. The switches may introduce some internal capacitance to the system, which in high-speed scanning systems may increase the discharge time constant of the sensors defined by each node, and potentially reducing scanning speed. For applications where scanning speed is not relevant, one of the single-pole double-throw switches may be directly connected to ground, mitigating errors that may result when resistors discharge into a ground.

A transimpedance amplifier directly converts the output current to output voltage.

An integrator and control circuit may also be used to convert the output current to output voltage, and acts on integrated current, which may decrease the noise in the circuit. Two analog switches and additional circuitry to control the switches may be included to support use of the integrator. An integrator circuit may include an opamp, a reset switch and an integrating capacitor.

The output voltage is not fed into a feedback control circuit that allows for the adjustment of the driving voltage. Rather, the same driving voltage source is in electrical communication with each node, which may provide efficiencies, reduce complexity and reduce circuit cost compared with systems that include a feedback control circuit.

The system may be applied to clothing, vests, belts, foot pressure insoles, shoes, orthotics, socks, body suits, smart bandages, EEG caps, foam, sleep surfaces and other furniture, blankets, car seats, robotic surgery with haptic feedback, augmentation of sensation, direction finding, gunshot detection and resistive touch screens. In addition to providing design information, the system can be used for other applications. For example, the system can be used to monitor apnea or to detect the exit of a patient from a bed. In the case of a resistance measurement array for measuring pressure, the weight of a patient can be determined and indicated on a display by summing the pressures that are measured at each node. The pressures that are measured at each node may be converted to colours and displayed on a display. The resistive array may be used as part of a dynamic feedback system in which the contour of a bed is automatically adjusted in response to movements of the patient to accommodate various reclining positions.

The resistance measurement array may use variable resolution scanning. With variable resolution scanning, the input multiplexor may be powered up and taken out of reset. The voltage representing the selected node resistance is present on the multiplexers' analog output for analog to digital conversion. To read the next sensor, a clock pulse is provided from a processor to a counter. The analog value representing the resistance of the next node appears on the output electrode and settles, then is ready for analog to digital conversion. In applications of the system in which the nodes are scanned in a sequence, scanning resolution may be selected by skipping some of the nodes in a scan pattern. For example, a protocol could include resetting the system, reading a first node, clocking the counter three times, reading a fourth node, clocking the counter three times, reading a seventh node and continuing. Once resistance has been measured at the final node, then ¼ of the resistance measurement array will have been read, reading from ¼ of the area resolution of the sensors.

The system may also be applied to non-sequential scanning of the resistance measurement array. The multiplexer and clocking to a selected node precedes the current-to-voltage conversion of the output current and analog-to-digital conversion of the resulting output voltage. This may be repeated to collect output voltages for other selected nodes in a selected sequence. Alternatively, if the input multiplexor is driven by a loadable counter instead of a sequential counter, then a scanning pattern for the selected nodes may be loaded into the counter and the resistance of the selected node read based on the scanning pattern.

A calibration circuit may be used to calibrate the system. The calibration circuit may provide a known value, such as resistance, between the selected input electrode and the selected output electrode. Upon start-up of the pressure measurement system, the calibration circuit may be applied to an open node (i.e. infinite resistance) and a known resistor, and compute the gain of the system.

FIG. 1 is a resistance measurement system 100 in operation. The system 100 includes a driving voltage source 110 in electrical communication with an input circuit 120. The input circuit 120 is also in electrical communication with an output circuit 130. A measurement array 104 is positioned intermediate the input circuit 120 and the output circuit 130. A transimpedance amplifier 140 is in communication with the output circuit 130 for receiving an output current, and converting and amplifying the output current to an output voltage. The transimpedance amplifier 140 is in communication with a processor 180 for receiving and processing the output voltage.

The driving voltage source 110 provides a driving voltage to the input circuit 120, causing current to flow into the selected input electrode 106a (described below). The input switches 124 (described below) route error currents to the input ground 126 (described below) away from the selected node 102a (described below). Similarly, the output switches 134 (described below) route error currents to the ground 136 (described below) and away from the transimpedance amplifier 140. The driving voltage source 110 is connected to a driving voltage ground 116. Isolating the error currents from the selected input electrode 106a facilitates measurement of resistance at the selected node 102a. Where the system 100 is applied to sensing or detection of a property external to the system 100 based on changes in the resistance of the measurement array 104 resulting from changes in the property, the improved sensitivity of the sensor may be facilitated by isolation of the error.

The input circuit 120 is in communication with the measurement array 104 through a plurality of input electrodes 106. The output circuit 130 is in communication with the measurement array 104 through a plurality of output electrodes 108. A plurality of nodes 102 are defined at intersections between the input electrodes 106 and the output electrodes 108. The plurality of nodes 102 are distributed in the measurement array 104.

The measurement array 104 includes the nodes 102 at intersections of the plurality of the input electrodes 106 and plurality of the output electrodes 108. The input electrodes 106 and the output electrodes 108 are organized into columns and orthogonal rows. The relative orientations of the rows and columns may be interchangeable, or the input electrodes 106 and the output electrodes 108 applied in non-orthogonal orientations between leads of input electrodes and leads of output electrodes in a resistance measurement system. The columns in the measurement array 104 include the input electrodes 106, and the rows include the output electrodes 108. The measurement array 104 may be applied for detecting changes in a property of an environment or other system being measured.

At each intersection of the input electrodes 106 and the output electrodes 108 is one of the nodes 102. Each node 102 may have a resistance that is sensitive to, and altered by, changes in a property of the environment external to the system 100 (e.g. pressure, stress, strain, biometrics, temperature, sound intensity or quality, light intensity or quality, electromagnetic fields, humidity, moisture, voltage, current, heart rate or other organ function, atrial fibrillation, breathing, physical movement, etc.). Variations in the property at a node 102 may result in measurable variations in the resistance the of measurement array 104 at the node 102 between the input electrode 106 and the output electrode 108. The magnitude of the property applied to each node 102 correlates to a measurable and predictable change in the resistance of the measurement array 104 at the node 102.

The input circuit 120 allows isolation of one input electrode 106 to receive the driving voltage from the driving voltage source 110 and apply the driving voltage to the measurement array 104. The input circuit 120 includes an input multiplexor 122 and a plurality of input switches 124. The input switches 124 may be single-pole double-throw switches. The input switches 124 may be connected to an input ground 126. The input ground 126 may provide a true ground, a positive virtual input ground, a stable fixed voltage or any suitable ground.

Each of the input electrodes 106 is connected with an input switch 124. The input multiplexor 122 is also connected to each of the input switches 124. Each input electrode 106 may be connected to either the driving voltage source 110 or the input ground 126 through the input switches 124 by selection from the input multiplexor 122.

The output circuit 130 includes an output multiplexor 132 and output switches 134. The output switches 134 may be single-pole double-throw output switches. The output switches 134 are connected to an output ground 136. The output ground 136 may include a true ground, a positive virtual input ground, a stable fixed voltage or any suitable ground. The driving voltage ground 116, the input ground 126 and the output ground 136 are electrically equivalent regardless of the specific ground applied at each of driving voltage ground 116, the input ground 126 and the output ground 136. The driving voltage ground 116, the input ground 126 and the output ground 136 may be in electrical communication.

Together, the input switches 124 and the output switches 134 provide a switching system in operative communication with the input electrodes 106 and the output electrodes 108 for selecting the selected node 102a (described below).

The input multiplexor 122 and the input switches 124 are controlled by a counter 128. The counter 128 opens and closes the input switches 124 and the output switches 134 to select different nodes 102 from which to acquire data of the property being sensed by the system 100 or for other applications of measuring resistance. The output multiplexor 132 is in communication with the counter 128. The counter 128 may be configured to scan through the input electrodes 106 and then increment the output multiplexor 132 to scan the next output electrode 108 as the selected output electrode 108a. The scan rate of the input multiplexor 120 may be n times the scan rate of output multiplexor 132 where n is the number of input switches 124. The scan rate of the output multiplexor 132 may be n times the scan rate of multiplexor 122 where n is the number of output switches 134.

The transimpedance amplifier 140 is configured to transform the output current into an amplified, measurable voltage. The system 100 uses the driving voltage to create a current at the selected node 102a and the transimpedance amplifier 140 converts the current to voltage. The transimpedance amplifier 140 may be substituted by any operational amplifier configured as a transimpedance amplifier. The transimpedance amplifier may be substituted with an integrator and control circuit, as in the system 300 of FIG. 3, the system 400 of FIG. 4, the system 500 of FIG. 5 and the system 600 of FIG. 6. A transimpedance amplifier directly converts the output current to output voltage. An integrator also converts the output current to output voltage, with the current being integrated. An integrator circuit may decrease the noise in the amplified output voltage. When applying an integrator circuit, two analog switches may be included in the system along with additional circuitry to control the switches. An integrator circuit may include an opamp, a reset switch and an integrating capacitor.

The transimpedance amplifier 140 is connected to an amplifier ground 146. The amplifier ground 146 may be a true ground, a positive virtual input ground, a stable fixed voltage, or any suitable ground.

A linearization circuit 138 is located between the input circuit 120 and the output circuit 130 and in parallel with the measurement array 104. The linearization circuit 138 is configured to increase the output voltage into a range with resolution selected for a particular application of the system 100. The linearization circuit 138 may include a large value resistor. The large value resistor may be applied in the linearization circuit 138 to lower the equivalent resistance of the selected node 102a when applying the driving voltage to a selected node 102a with a high resistance, linearizing the output voltage across various ranges of the resistance of the electrical component of the selected node 102a. The linearization circuit 138 reduces the resistance of the circuit including the input circuit 120, the measurement array 104 and the output circuit 130, increasing the output voltage. The linearizing circuit facilitates measurement of larger resistance values at the selected node 102a, and correspondingly lower output currents and output voltages, than the circuit including the input circuit 120, the measurement array 104 and the output circuit 130 would otherwise be able to measure.

In operation, resistance at a selected node 102a may be measured when the driving voltage is applied to a selected input electrode 106a, and the output current is received at a selected output electrode 108a. The magnitude of the output current is converted to voltage through the transimpedance amplifier 140 and the magnitude of the output voltage will depend on the resistance at the selected node 102a. The resistance at the selected node 102a changes with the magnitude of the property applied at the selected node 102a. The driving voltage is applied to the selected input electrode 106a and not applied to remaining input electrodes 106b. The resistance at the selected node 102a is calculated from the measured voltage from the following equations:

$$I_{measure} = (V_v - V_d)/R \quad (1)$$

$$V_o = V_v + I_{measure} \times R_g \quad (2)$$

$$R = ((V_v - V_d) \times R_g)/(V_o - V_v) \quad (3)$$

In equations 1, 2 and 3, R is the resistor being measured, $V_v$ is the voltage of virtual ground (e.g. 0.2 V), $V_d$ is the driving voltage (e.g. 0.15V), $I_{measure}$ is the current flowing through R, $R_g$ is the value of gain resistor on transimpedance amplifier, and $V_o$ is the Voltage output from the transimpedance amplifier while Imeasure flows through R.

When the input multiplexor 122 selects the selected input electrode 106a to receive the driving voltage from the driving voltage source 110, the selected input electrode 106a is connected to the driving voltage source 110 through the selected input switch 124a and remaining input electrodes 106b are each connected with the input ground 126 through remaining input switches 124b. The selected input switch 124a provides electrical communication between the driving voltage source 110 and the selected input electrode 106a only, and not with the remaining input electrodes 106b.

The counter 128 counts incrementally, and selects a new input electrode 106 to be the selected input electrode 106a with the driving voltage source 110 as the count increments. In this way, the counter 128 and the input circuit 120 scan across the input electrodes 106, placing the driving voltage source 110 in electrical communication with each input electrode 106 sequentially. The counter 128 also selects an output electrode 108 to be included in an output circuit 130 as the selected output electrode 108a.

The output multiplexor 132 selects the selected output electrode 108a from which to receive the output current. A selected output switch 134a is associated with the selected output electrode 108a, providing electrical communication with the transimpedance amplifier 140. The remaining output electrodes 108b are each connected to the output ground 136 through remaining output switches 134b.

The selected input electrode 106a and the selected output electrode 108a define the selected node 102a at the intersection of the selected input electrode 106a and the selected output electrode 108a. The selected node 102a receives the driving voltage from the driving voltage source 110. The resistance of the measurement array 104 at the selected node 102a determines the output current that results from the driving voltage. The output voltage is converted from the output current and amplified by the transimpedance amplifier 140 for provision to the processor 180. The remaining output electrodes 108b are connected to the output ground 136 through the remaining output switches 134b, isolating the selected node 102a from the effects of impedance, resistance or other electrical changes in the remaining nodes 102b.

A calibration circuit 150 may be used to calibrate the system 100. The calibration circuit 150 may effectively act as a known value, such as resistance, between the selected input electrode 106a and the selected output electrode 108a. Upon start-up of the system 100, the processor 180 or a processor on another system (not shown) may read the calibration circuit 150 initially, and compute the gain of the system 100.

Calibration of the system 100 may include measurement of $V_v$ for an open node (i.e. infinite resistance) and $((V_v - V_d) * R_g)$ is measured using a known resistor. Any unknown resistance may be determined from the output voltage of the transimpedance amplifier 140 using the values determined from calibration.

All components of the system 100 will have tolerances that result in small variations in the driving voltage, the ground voltage and the gain of the transimpedance amplifier 140. One node 102 of the measurement array 104 may be replaced by the calibration resistor 150 or the calibration resistor 150 may be in electrical communication with the input circuit 120 and the output circuit 130. The calibration resistor is of known value and known tolerance. One node 102 of the measurement array 104 may be an open node that is not populated with an electrical component (i.e. the resistance at this node 102 is infinite). To measure the value of the ground 146, clock pulses are issued to clock the array 104 to select the open node 102 and the amplifier ground 146 is now read from the transimpedance amplifier 140.

To measure the gain of the circuit including the input electrode 120, the measurement array 104 and the output electrode 130, clock pulses are issued to clock the measurement array 104 to select the calibration resistor. With the output voltage from the transimpedance amplifier 140, the value of the amplifier ground 146 voltage, and the known value of the calibration resistor in the calibration circuit 150, one can calculate the gain, and in turn calculate the gain multiplied by the difference between the driving voltage and the amplifier ground 146.

The transimpedance amplifier 140 increases the sensitivity of the system 100 to changes in the property at the selected node 102a. The increased sensitivity may provide advantages in applications where maximizing measurement resolution is a primary goal, and where the importance of resolution outweighs the importance of high scanning speeds. The transimpedance amplifier 140 also increases the range of signals that can be read. An amplifier ground 146 is one of the inputs to the transimpedance amplifier 140. The transimpedance amplifier 140 does not present any cutoff voltage or other signal below which signals will not be registered. The amplified signal may then be relayed to the processor 180 including an onboard analog-to-digital converter for further processing.

Figure 2:
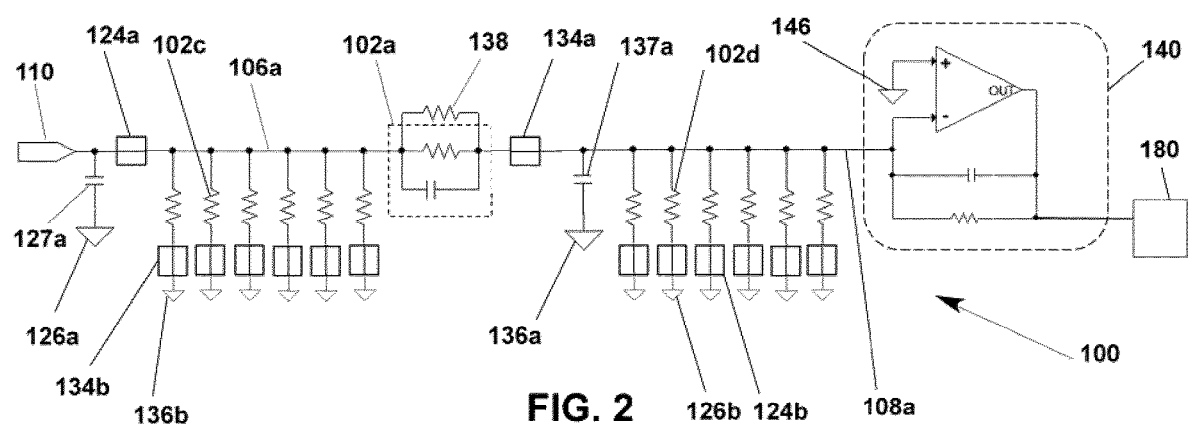
FIG. 2 is a schematic representation of an equivalent circuit on a selected node in the resistance measurement array of FIG. 1.

FIG. 2 is a schematic circuit representation of the system 100 in operation on the selected node 102a. The system 100 includes the driving voltage source 110 in electrical communication with the selected input electrode 106a and the output current is received on the selected output electrode 108a. The transimpedance amplifier 140 is in communication with the selected output electrode 108a for receiving the output current, and converting and amplifying the output current into the output voltage. The processor 180 is in communication with the transimpedance amplifier 140 for receiving and processing the output voltage.

The selected input electrode 106a is in communication with the selected output electrode 108a, activating the selected node 102a. The equivalent circuit shows the equivalent impedances that the driving voltage 110 is subject to as it travels through the selected node 102a between the selected input 106a and the selected output 108a. The selected input switch 124a introduces a capacitance 127a between the driving voltage source 110 and the selected input ground 126a. The remaining input switches 124b introduce a capacitance 137a that is compensated for by capacitance inherent to the driver that generates the driving voltage 110. Similarly, the remaining nodes 102b are connected to the selected output ground 136b through remaining output switches 134b (remaining nodes 102b are not shown in FIG. 2).

The driving voltage 110 is driven from the selected input electrode 106a, through the selected node 102a, which acts as a resistance with a minimal capacitance, and to the selected output electrode 108a. The capacitance 127a in the selected node 102a may be very small compared to capacitances introduced by the selected switch 124a. The linearization circuit 138 is in parallel with the selected node 102a and is shown as a large-value resistor. The output current is conveyed to the transimpedance amplifier 140 that is grounded to the amplifier ground 146. The output current is conveyed through the transimpedance amplifier 140 and converted to an output voltage that may then be passed on to a processor 180 or an analog to digital converter.

The selected node 102a can be expressed in equivalent circuit terms as a resistance with a minimal capacitance. The capacitance 127a in the selected node 102a will be very small compared to the capacitances introduced by the switches 124 and 134. The remaining nodes 102b can be expressed, in equivalent circuit terms, as resistances which are connected to the input ground 126 and output ground 136. The input switch 124 introduces a capacitance that is compensated for by the capacitance inherent to the driver that generates the driving voltage 110.

The driving voltage source 110 is connected with the selected input electrode 106a through the selected input switch 124a. The voltage on the selected input electrode 106a is equal to the driving voltage. The current that flows through unselected resistors 102c on the selected input electrode 106a in turn flows through the unselected output switches 134b to the unselected output grounds 136b, isolating the current and mitigating any effects that residual capacitance may have on the circuit upstream of the transimpedance amplifier 140. The voltage of the selected output electrode 108a is the same as virtual ground 146 and of the unselected input grounds 126b through the unselected input switches 124b. Since both ends of the unselected resistors 102d on the selected output electrode 108a are at the same potential, no current flows in them. The overall result is that the arrangement of the system 100 isolates the driving voltage and the output current to the selected node 102a and allows conversion of the output current to the output voltage by the transimpedance amplifier 140.

Figure 3:
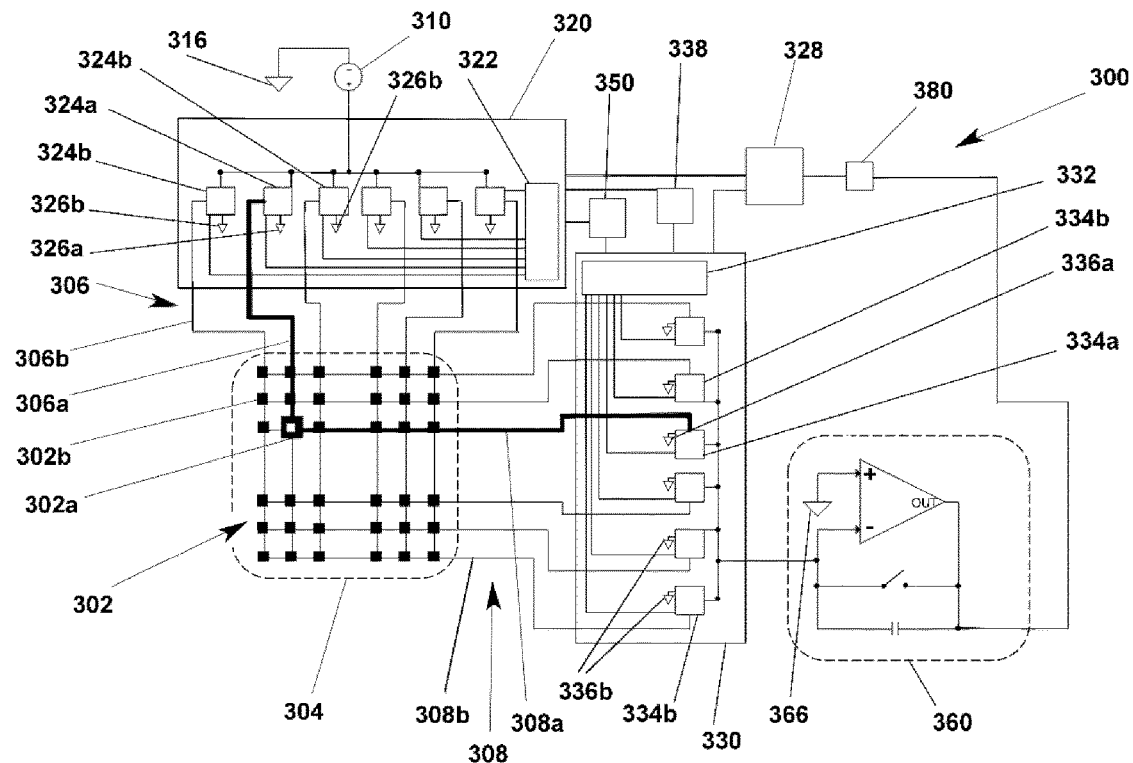
FIG. 3 is a circuit drawing of a resistance measurement array.

FIG. 3 is a resistance measurement system 300 in operation. The system 300 includes the driving voltage source 310 in electrical communication with the input circuit 320. The input circuit 320 is also in electrical communication with the output circuit 330. The measurement array 304 for detecting changes in a property of a system being measured is positioned intermediate the input circuit 320 and the output circuit 330. An integrator and control circuit 360 is in communication with the output circuit 330 for receiving the output current from the selected output electrode 308a and converting the output current into an output voltage. The integrator and control circuit 360 is in communication with the processor 380 for receiving and processing the output voltage.

The driving voltage source 310 provides the driving voltage to the input circuit 320 for detection of the property based on changes in the electrical properties of the measurement array 304 resulting from changes in the property.

The input circuit 320 is in communication with the measurement array 304 through the input electrodes 306. The output circuit 330 is in communication with the measurement array 304 through the output electrodes 308. The nodes 302 are defined at the intersections between the input electrodes 306 and the output electrodes 308. The nodes 302 are distributed in the measurement array 304.

The measurement array 304 includes the nodes 302 at intersections of the input electrodes 306 and the output electrodes 308. The input electrodes 306 and the output electrodes 308 are organized into columns and orthogonal rows. The relative orientations of the rows and columns may be interchangeable, or the input electrodes and the output electrodes applied in non-orthogonal orientations between leads of input electrodes and leads of output electrodes in a resistive sensor system. The columns in the measurement array 304 include the input electrodes 306, and the rows include the output electrodes 308.

At each intersection of the input electrodes 306 and the output electrodes 308 is one of the nodes 302. Each node 302 has a resistance that is sensitive to, and altered by, changes in a property of the environment external to the system 300. Variations in the property at a node 302 result in measurable variations in the resistance of the measurement array 304 at the node 302 between the input electrode 306 and the output electrode 308. The magnitude of the property applied to each node 302 correlates to a measurable and predictable change in the resistance of the measurement array 304 at the node 302 between the input electrode 306 and output electrode 308.

The input circuit 320 allows isolation of one input electrode 306 to receive the driving voltage from the driving voltage source 310 and apply the driving voltage to the measurement array 304. The input circuit 320 includes the input multiplexor 322 and the input switches 324. The input switches 324 may be single-pole double-throw switches. The input switches 324 may be connected to an input ground 326. The input ground 326 may provide a true ground, a positive virtual input ground, a stable fixed voltage or any suitable ground.

Each of the input electrodes 306 is connected with an input switch 324. The input multiplexor 322 is also connected to each of the input switches 324. Each input electrode 306 may be connected to either the driving voltage source 310 or the input ground 326 through the input switches 324 by selection from the input multiplexor 322.

The output circuit 330 includes the output multiplexor 332 and the output switches 334. The output switches 334 may be single-pole double-throw output switches. The output switches 334 are connected to an output ground 336. The output ground 336 may include a true ground, a positive virtual input ground, a stable fixed voltage or any suitable ground.

The input multiplexor 322 and the input switches 324 are controlled by the counter 328. The counter 328 opens and closes the input switches 324 and the output switches 334 to select different nodes 302 from which to acquire data of the property being sensed by the system 300 or for other applications of measuring resistance. The output multiplexor 332 is in communication with the counter 328. The counter 328 may be configured to scan through the input electrodes 306 and then increment the output multiplexor 332 to scan the next output electrode 308 as the selected output electrode 308a. The scan rate of the input multiplexor 320 may be n times the scan rate of output multiplexor 332 where n is the number of input switches 324. The scan rate of the output multiplexor 332 may be n times the scan rate of multiplexor 322 where n is the number of output switches 334.

The integrator and control circuit 360 is configured to transform the output current into an amplified, measurable output voltage. The system 300 uses a voltage-based driving voltage and the integrator and control circuit 360 may include any suitable voltage amplifier. The integrator and control circuit 360 is connected to an integrator ground 366. The integrator ground 366 may be a true ground, a positive virtual input ground, a stable fixed voltage or any suitable ground.

The driving voltage ground 316, the input ground 326, the output ground 336 and the integrator ground 366 are electrically equivalent regardless of the specific ground applied at each of driving voltage ground 316, the input ground 326, the output ground 336 and the integrator ground 366.

The linearization circuit 338 is located between the input circuit 320 and the output circuit 330 and in parallel with the measurement array 304 for adjusting the output voltage to a range with resolution selected for a particular application of the system 300. The linearization circuit 338 may include the large value resistor. The large value resistor may be applied in the linearization circuit 338 to lower the equivalent resistance of the selected node 302a when applying the driving voltage to a selected node 302a with a high resistance, linearizing the output voltage across various ranges of the resistance of the electrical component of the selected node 302a. The linearization circuit 338 reduces the resistance of the circuit including the input circuit 320, the measurement array 304 and the output circuit 330, increasing the output voltage. The linearizing circuit facilitates measurement of larger resistance values at the selected node 302a, and correspondingly lower output voltages, than the circuit including the input circuit 320, the measurement array 304 and the output circuit 330 would otherwise be able to measure.

In operation, resistance at the selected node 302a may be measured when the driving voltage is applied to the selected input electrode 306a, and the output current is received at the selected output electrode 308a. The magnitude of the output current is converted to voltage through the integrator and control circuit 360 and the magnitude of the output voltage will depend on the resistance at the selected node 302a. The resistance at the selected node 302a changes with the magnitude of the property applied at the selected node 302a. The driving voltage is applied to the selected input electrode 306a and not applied to remaining input electrodes 306b.

When the input multiplexor 322 selects the selected input electrode 306a to receive the driving voltage from the driving voltage source 310, the selected input electrode 306a is connected to the driving voltage source 310 and the remaining input electrodes 306b are each connected with the input ground 326 through remaining input switches 324b. The selected input switch 324a provides electrical communication between the driving voltage 310 and the selected input electrode 306a only, and not with the remaining input electrodes 306b.

The counter 328 counts incrementally, and selects a new input electrode 306 to be the selected input electrode 306a with the driving voltage source 310 as the count increments. In this way, the counter 328 and the input circuit 320 scan across the input electrodes 306, placing the driving voltage source 310 in electrical communication with each input electrode 306 sequentially. The counter 328 also selects an output electrode 308 to be included in an output circuit 330 as the selected output electrode 308a.

The output multiplexor 332 selects the selected output electrode 308a from which to receive the output current. A selected output switch 334a is associated with the selected output electrode 308a, providing electrical communication with the integrator and control circuit 360. The remaining output electrodes 308b are each connected to the output ground 336 through remaining output switches 334b.

The selected input electrode 306a and the selected output electrode 308a define the selected node 302a at the intersection of the selected input electrode 306a and the selected output electrode 308a. The selected node 302a receives the driving voltage from the driving voltage source 310. The resistance of the measurement array 304 at the selected node 302a is read by the integrator and control circuit 360 and the output current is converted and amplified to the output voltage for provision to the processor 380. The remaining output electrodes 308b are connected to the output ground 336 through the output switches 334, isolating the selected node 302a from the effects of impedance, resistance or other electrical changes in the remaining nodes 302b.

The calibration circuit 350 may be used to calibrate the system 300. Upon start-up of the system 300, the processor 380 or a processor on another system (not shown) may read the calibration circuit 350 initially, and compute the gain of the system 300.

The integrator and control circuit 360 increases the sensitivity of the system 300 to changes in the property at the selected node 302a. The increased sensitivity may provide advantages in applications where maximizing measurement resolution is a primary goal, and where the importance of resolution outweighs the importance of high scanning speeds. The integrator and control circuit 360 also increases the range of signals that can be read. The output current from the selected output electrode 308a is received by the integrator and control circuit 360. The amplified output voltage may then be relayed to the processor 380 including an onboard analog-to-digital converter for further processing.

Figure 4:
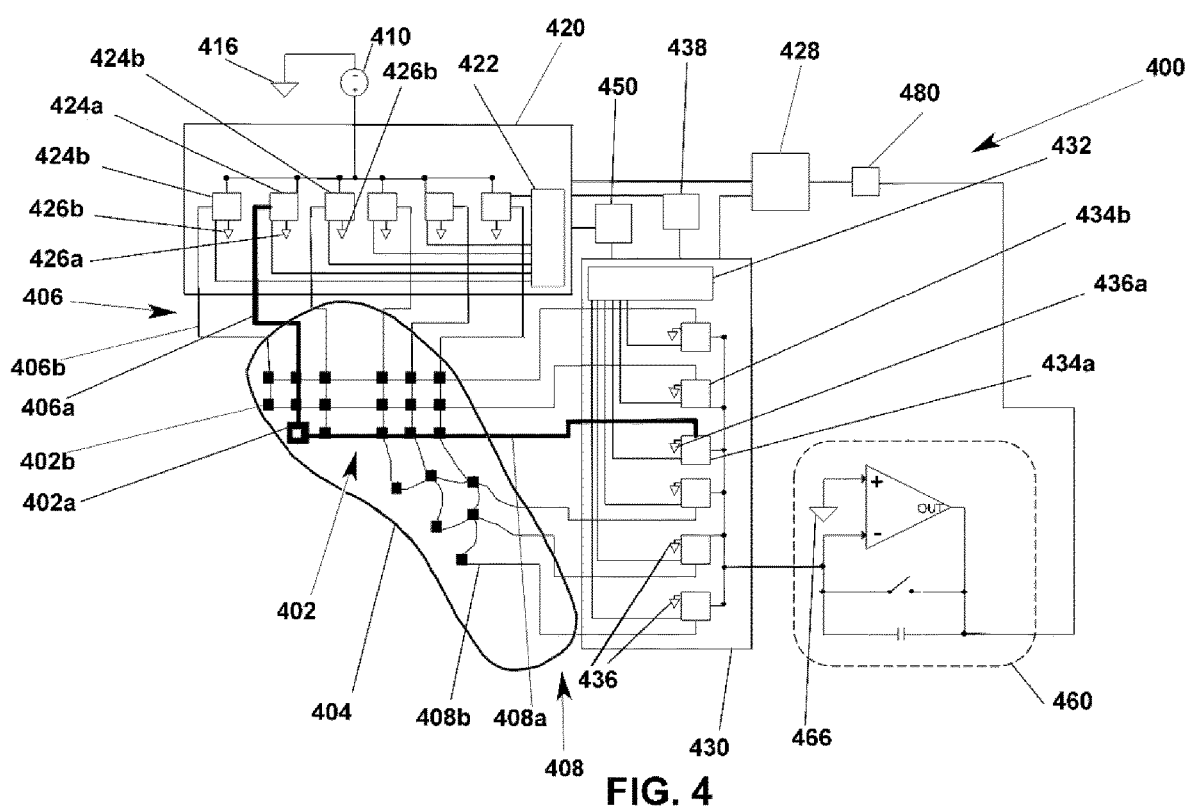
FIG. 4 is a circuit drawing of a resistive pressure sensor array.

FIG. 4 is a resistive pressure sensor system 400 in operation. The system 400 includes the driving voltage source 410 in electrical communication with the input circuit 420. The input circuit 420 is also in electrical communication with the output circuit 430. The sensor array 404 for detecting changes in pressure being applied to the sensor array 404 positioned intermediate the input circuit 420 and the output circuit 430. The integrator and control circuit 460 is in communication with the output circuit 430 for receiving the output current from the selected output electrode 408a and converting the output current into an output voltage. The integrator and control circuit 460 is in communication with the processor 480 for receiving and processing the output voltage.

The driving voltage source 410 provides the driving voltage to the input circuit 420 for detection of applied pressure based on changes in the electrical properties of the sensor array 404 resulting from changes in applied pressure on the sensor array 404.

The input circuit 420 is in communication with the sensor array 404 through the input electrodes 406. The output circuit 430 is in communication with the sensor array 404 through the output electrodes 408. The nodes 402 are defined at the intersections between the input electrodes 406 and the output electrodes 408. The nodes 402 are distributed in the sensor array 404.

The sensor array 404 includes the nodes 402 at intersections of the input electrodes 406 with the output electrodes 408. The input electrodes 406 and the output electrodes 408 are distributed across the sensor array, which is on an insole for use in a shoe. Some of the nodes are distributed orthogonally to each other while others are distributed in a non-orthogonal pattern.

At each intersection of the input electrodes 406 and the output electrodes 408 is one of the nodes 402. Each node 402 has a resistance that is sensitive to, and altered by, changes in a pressure applied to the sensor array 404. Variations in the pressure at a node 402 result in measurable variations in the resistance of the sensor array 404 at the nodes 402. The magnitude of the pressure applied to each node 402 correlates to a measurable and predictable change in the resistance of the sensor array 404 at the node 402 between the input electrode 406 and output electrode 408.

The input circuit 420 allows isolation of one input electrode 406 to receive the driving voltage from the driving voltage source 410 and apply the driving voltage to the sensor array 404. The input circuit 420 includes the input multiplexor 422 and the input switches 424. The input switches 424 may be single-pole double-throw switches. The input switches 424 may be connected to an input ground 426. The input ground 426 may provide a true ground, a positive virtual input ground, a stable fixed voltage or any suitable ground.

Each of the input electrodes 406 is connected with an input switch 424. The input multiplexor 422 is also connected to each of the input switches 424. Each input electrode 406 may be connected to either the driving voltage source 410 or the input ground 426 through the input switches 424 by selection from the input multiplexor 422.

The output circuit 430 includes the output multiplexor 432 and the output switches 434. The output switches 434 may be single-pole double-throw output switches. The output switches 434 are connected to an output ground 436. The output ground 436 may include a true ground, a positive virtual input ground, a stable fixed voltage or any suitable ground.

The input multiplexor 422 and the input switches 424 are controlled by the counter 428. The counter 428 opens and closes the input switches 424 and the output switches 434 to select different nodes 402 from which to acquire data of the pressure being sensed by the system 400. The output multiplexor 432 is in communication with the counter 428. The counter 428 may be configured to scan through the input electrodes 406 and then increment the output multiplexor 432 to scan the next output electrode 408 as the selected output electrode 408a. The scan rate of the input multiplexor 420 may be n times the scan rate of output multiplexor 432 where n is the number of input switches 424. The scan rate of the output multiplexor 432 may be n times the scan rate of multiplexor 422 where n is the number of output switches 434.

The integrator and control circuit 460 is configured to transform the output current into the amplified and measurable output voltage. The system 400 uses a voltage-based driving voltage and the integrator and control circuit 460 may be any suitable voltage amplifier. The integrator and control circuit 460 is connected to the integrator ground 466.

The integrator ground 466 may be a true ground, a positive virtual input ground, a stable fixed voltage or any suitable ground.

The driving voltage ground 416, the input ground 426, the output ground 436 and the integrator ground 466 are electrically equivalent regardless of the specific ground applied at each of driving voltage ground 416, the input ground 426, the output ground 436 and the integrator ground 466.

The linearization circuit 438 is located between the input circuit 420 and the output circuit 430 and in parallel with the sensor array 404 for adjusting the output voltage to a range with resolution selected for a particular application of the system 400. The linearization circuit 438 may include the large value resistor. The large value resistor may be applied in the linearization circuit 438 to lower the equivalent resistance of the selected node 402a when applying the driving voltage to a selected node 402a with a high resistance, linearizing the output voltage across various ranges of the resistance of the electrical component of the selected node 402a. The linearization circuit 438 reduces the resistance of the circuit including the input circuit 420, the measurement array 404 and the output circuit 430, increasing the output voltage. The linearizing circuit facilitates measurement of larger resistance values at the selected node 402a, and correspondingly lower output voltages, than the circuit including the input circuit 420, the measurement array 404 and the output circuit 430 would otherwise be able to measure.

In operation, resistance at the selected node 402a may be measured when the driving voltage is applied to the selected input electrode 406a, and the output current is received at the selected output electrode 408a. The magnitude of the output current is converted to voltage through the integrator and control circuit 460 and the magnitude of the output voltage will depend on the resistance at the selected node 402. The resistance at the selected node 402a changes with the magnitude of the pressure applied at the selected node 402a. The driving voltage is applied to the selected input electrode 406a and not applied to remaining input electrodes 406b.

When the input multiplexor 422 selects the selected input electrode 406a to receive the driving voltage from the driving voltage source 410, the selected input electrode 406a is connected to the driving voltage source 410 and the remaining input electrodes 406b are each connected with the input ground 426 through remaining input switches 424b. The selected input switch 424a provides electrical communication between the driving voltage 410 and the selected input electrode 406a only, and not with the remaining input electrodes 406b.

The counter 428 counts incrementally, and selects a new input electrode 406 to be the selected input electrode 406a with the driving voltage source 410 as the count increments. In this way, the counter 428 and the input circuit 420 scan across the input electrodes 406, placing the driving voltage source 410 in electrical communication with each input electrode 406 sequentially. The counter 428 also selects an output electrode 408 to be included in an output circuit 430 as the selected output electrode 408a.

The output multiplexor 432 selects the selected output electrode 408a from which to read the output current. A selected output switch 434a is associated with the selected output electrode 408a, providing electrical communication with the integrator and control circuit 460. The remaining output electrodes 408b are each connected to the output ground 436 through remaining output switches 434b.

The selected input electrode 406a and the selected output electrode 408a define the selected node 402a at the intersection of the selected input electrode 406a and the selected output electrode 408a. The selected node 402a receives the driving voltage from the driving voltage source 410. The resistance of the sensor array 404 at the selected node 402a, and the corresponding pressure or other environmental property exposed to the selected node 402a, is calculated by the processor 480 based on the output voltage converted from the output current integrator and control circuit 460. The remaining output electrodes 408b are connected to the output ground 436 through the output switches 434, isolating the selected node 402a from the effects of impedance, resistance or other electrical changes in the remaining nodes 402b.

The calibration circuit 450 may be used to calibrate the system 400. Upon start-up of the system 400, the processor 480 or a processor on another system (not shown) may read the calibration circuit 450 initially, and compute the gain of the system 400.

The integrator and control circuit 460 increases the sensitivity of the system 400 to changes in the pressure at the selected node 402a. The increased sensitivity may provide advantages in applications where maximizing measurement resolution is a primary goal, and where the importance of resolution outweighs the importance of high scanning speeds. The integrator and control circuit 460 also increases the range of signals that can be read. The output current from the selected output electrode 408a is received by the integrator and control circuit 460. The amplified output voltage may then be relayed to the processor 480 including an onboard analog-to-digital converter for further processing.

Figure 5:
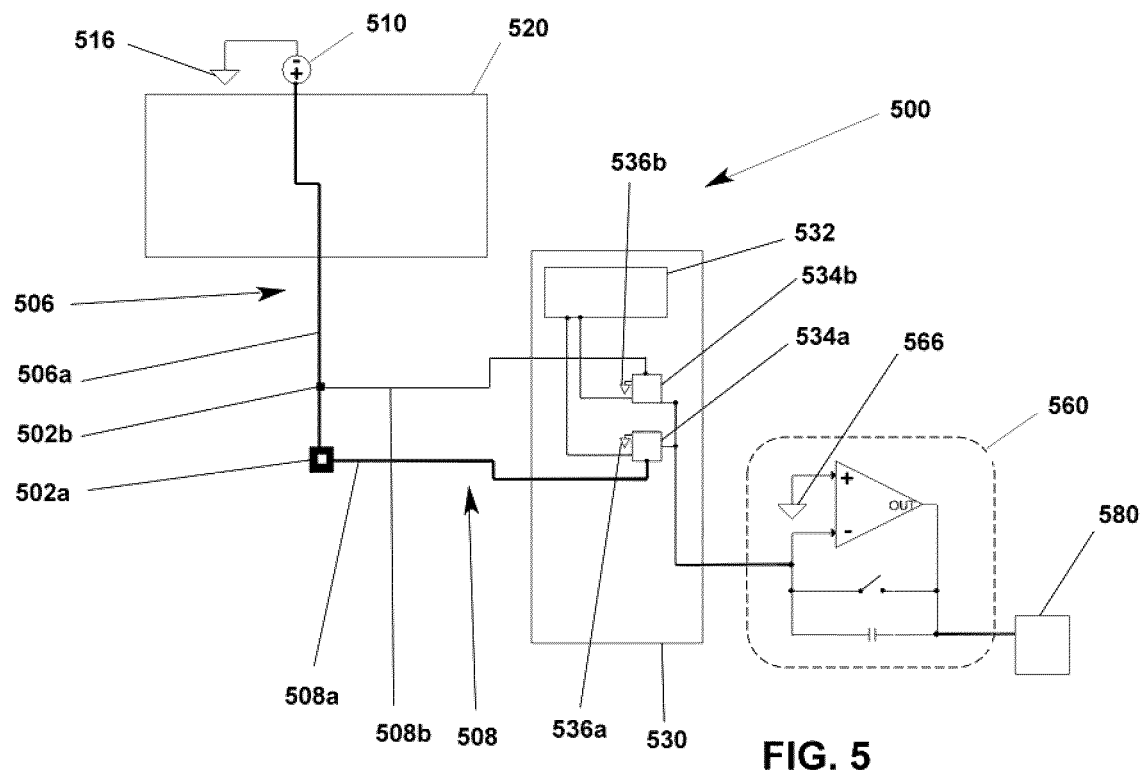
FIG. 5 is a circuit drawing of a resistance measurement array.

FIG. 5 is a resistance measurement system 500 in operation. The system 500 includes the driving voltage source 510 in electrical communication with the input circuit 520. The input circuit 520 is also in electrical communication with the output circuit 530. The measurement array 504 for detecting changes in a property a system being measured is positioned intermediate the input circuit 520 and the output circuit 530. The integrator and control circuit 560 is in communication with the output circuit 530 for receiving the output current from the selected output electrode 508a and converting the output current into an output voltage. The integrator and control circuit 560 is in communication with the processor 580 for receiving the output current and processing the output current into the output voltage.

The driving voltage source 510 provides the driving voltage to the input circuit 520 for detection of the property based on changes in the electrical properties of the measurement array 504 resulting from changes in the property.

The input circuit 520 is in communication with the measurement array 504 through the input electrode 506. The output circuit 530 is in communication with the measurement array 504 through the output electrodes 508. The nodes 502 are defined at the intersections between the input electrode 506 and the output electrodes 508. The nodes 502 are distributed in the measurement array 504.

The measurement array 504 includes the nodes 502 at intersections of the input electrode 506 with the output electrodes 508. At each intersection of the input electrode 506 and the output electrodes 508 is one of the nodes 502. Since there is only a single input electrode 506, the input electrode 506 is also effectively the selected input electrode 506a. Each node 502 has a resistance that is sensitive to, and altered by, changes in a property of the environment external to the system 500. Variations in the property at a node 502 result in measurable variations in the resistance of the measurement array 504 at the nodes 502. The magnitude of the property applied to each node 502 correlates to a measurable and predictable change in the resistance of the measurement array 504 at the nodes 502.

The output circuit 530 includes the output multiplexor 532 and the output switches 534. The output switches 534 may be single-pole double-throw output switches. The output switches 534 are connected to an output ground 536. The output ground 536 may provide a true ground, a positive virtual input ground, a stable fixed voltage or any suitable ground.

The output switches 534 open and close to select different nodes 502 from which to acquire data of the property being sensed by the system 500 or for other applications of measuring resistance.

The integrator and control circuit 560 is configured to transform the output current into an amplified, measurable output voltage. The system 500 uses a voltage-based driving voltage and the integrator and control circuit 560 may include any suitable voltage amplifier. The integrator and control circuit 560 is connected to an integrator ground 566. The integrator ground 566 may be a true ground, a positive virtual input ground, a stable fixed voltage or any suitable ground.

The driving voltage ground 516, the output ground 536 and the integrator ground 566 are electrically equivalent regardless of the specific ground applied at each of driving voltage ground 516, the output ground 536 and the integrator ground 566.

In operation, resistance at the selected node 502a may be measured when the driving voltage from the driving voltage source 510 is applied to the input electrode 506, and the output current is received at the selected output electrode 508a. The magnitude of the output current is converted to voltage through the integrator and control circuit 560 and the magnitude of the output voltage will depend on the resistance at the selected node 502a. The resistance at the selected node 502a changes with the magnitude of the property applied at the selected node 502a. The driving voltage is applied to the input electrode 506.

The output multiplexor 532 selects the selected output electrode 508a from which to receive the output current. A selected output switch 534a is associated with the selected output electrode 508a, providing electrical communication with the integrator and control circuit 560. The remaining output electrodes 508b are each connected to the output ground 536 through remaining output switches 534b. The output circuit 530 scans across the output electrodes 508 to select an output electrode 508 to be included in an output circuit 530 as the selected output electrode 508a.

The input electrode 506 and the selected output electrode 508a define the selected node 502a at the intersection of the input electrode 506 and the selected output electrode 508a. The selected node 502a receives the driving voltage from the driving voltage source 510. The resistance of the measurement array 504 at the selected node 502a is read by the transimpedance amplifier 540 and the output current is converted and amplified to the output voltage for provision to the processor 580. The remaining output electrodes 508b are connected to the output ground 536 through the output switches 534, isolating the selected node 502a from the effects of impedance, resistance or other electrical changes in the remaining nodes 502b.

The integrator and control circuit 560 increases the sensitivity of the system 500 to changes in the property at the selected node 502a. The increased sensitivity may provide advantages in applications where maximizing measurement resolution is a primary goal, and where the importance of resolution outweighs the importance of high scanning speeds. The integrator and control circuit 560 also increases the range of signals that can be read. The integrator and control circuit 560 does not present any cutoff voltage or other signal below which signals will not be registered. The amplified output voltage may then be relayed to the processor 580 including an onboard analog-to-digital converter for further processing.

Figure 6:
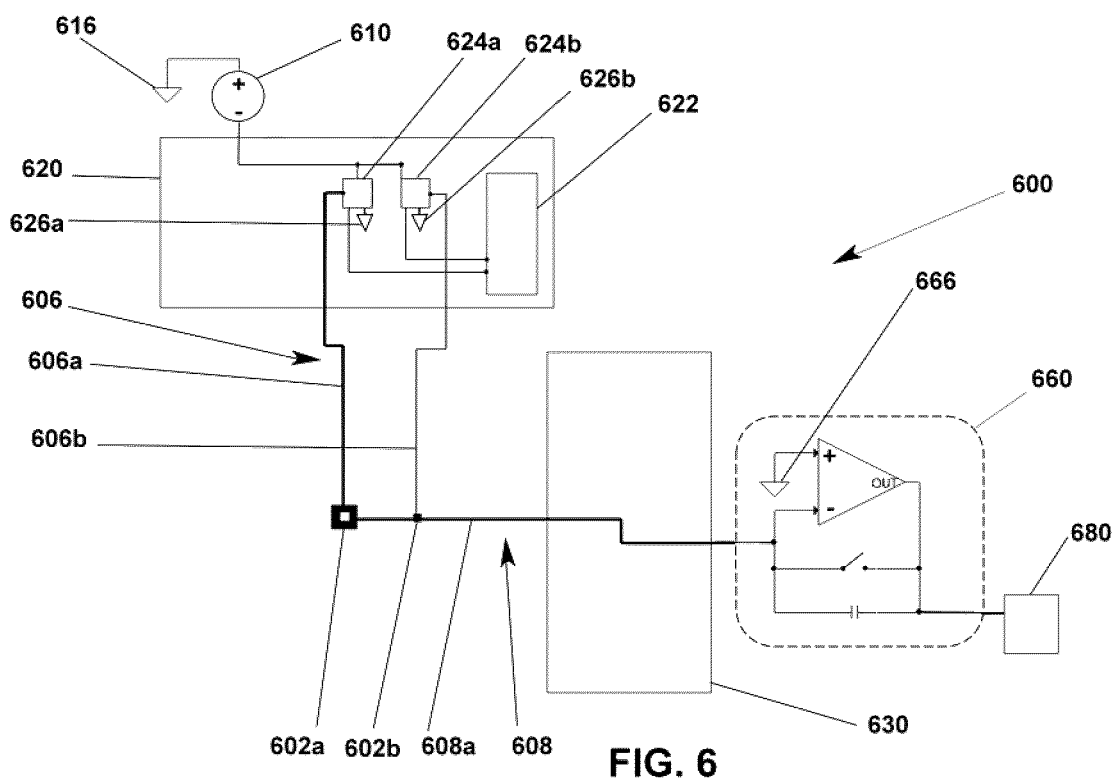
FIG. 6 is a circuit drawing of a resistance measurement array.

FIG. 6 is a resistance measurement system 600 in operation. The system 600 includes the driving voltage source 610 in electrical communication with the input circuit 620. The input circuit 620 is also in electrical communication with the output circuit 630. The measurement array 604 for detecting changes in a property a system being measured is positioned intermediate the input circuit 620 and the output circuit 630. The integrator and control circuit 660 is in communication with the output circuit 630 for receiving the output current from the output electrode 608 and converting the output current into an output voltage. The integrator and control circuit 660 is in communication with the processor 680 for receiving the output current and processing the output current into the output voltage.

The driving voltage source 610 provides the driving voltage to the input circuit 620 for detection of the property based on changes in the electrical properties of the measurement array 604 resulting from changes in the property.

The input circuit 620 is in communication with the measurement array 604 through the input electrodes 606. The output circuit 630 is in communication with the measurement array 604 through the output electrodes 608. The nodes 602 are defined at the intersections between the input electrodes 606 and the output electrodes 608. The nodes 602 are distributed in the measurement array 604.

The measurement array 604 includes the nodes 602 at intersections of the input electrode 606 with the output electrodes 608. At each intersection of the input electrode 606 and the output electrodes 608 is one of the nodes 602. Each node 602 has a resistance that is sensitive to, and altered by, changes in a property of the environment external to the system 600. Variations in the property at a node 602 result in measurable variations in the resistance of the measurement array 604 at the nodes 602. The magnitude of the property applied to each node 602 correlates to a measurable and predictable change in the resistance of the measurement array 604 at the nodes 602.

The input circuit 620 allows isolation of one input electrode 606 to receive the driving voltage from the driving voltage source 610 and apply the driving voltage to the measurement array 604. The input circuit 620 includes the input multiplexor 622 and the input switches 624. The input switches 624 may be single-pole double-throw switches. The input switches 624 may be connected to and input ground 626. The input ground 626 may provide a true ground, a positive virtual input ground, a stable fixed voltage or any suitable ground. The driving voltage ground 616 and the input ground 636 are electrically equivalent regardless of the specific ground applied at each of driving voltage ground 616 and the input ground 626. The driving voltage ground 616 and the input ground 626 may be in electrical communication.

Each of the input electrodes 606 is connected with an input switch 624. The input multiplexor 622 is also connected to each of the input switches 624. Each input electrode 606 may be connected to either the driving voltage source 610 or the input ground 626 through the input switches 624 by selection from the input multiplexor 622.

The input switches 624 open and close to select different nodes 602 from which to acquire data of the property being sensed by the system 600 or for other applications of measuring resistance.

The integrator and control circuit 660 is configured to transform the output current into an amplified, measurable voltage. The system 600 uses a voltage-based driving voltage and the integrator and control circuit 660 may be any suitable voltage amplifier. The integrator and control circuit 660 is connected to an integrator ground 666. The integrator ground 666 may be a true ground, a positive virtual input ground, a stable fixed voltage or any suitable ground.

The driving voltage ground 616 the input ground 626 and the integrator ground 666 are electrically equivalent regardless of the specific ground applied at each of driving voltage ground 616, the input ground 626 and the integrator ground 666.

In operation, resistance at the selected node 602a may be measured when the driving voltage is applied to the selected input electrode 606a, and the output current is received at the selected output electrode 608a. The magnitude of the output current is converted to voltage through the integrator and control circuit 660 and the magnitude of the output voltage will depend on the resistance at the selected node 602a. The resistance at the selected node 602a changes with the magnitude of the property applied at the selected node 602a. The driving voltage is applied to the selected input electrode 606a and not applied to remaining input electrodes 606b

When the input multiplexor 622 selects the selected input electrode 606a to receive the driving voltage from the driving voltage source 610, the selected input electrode 606a is connected to the driving voltage source 610 and the remaining input electrodes 606b are each connected with the input ground 626 through remaining input switches 624b. The selected input switch 624a provides electrical communication between the driving voltage 610 and the selected input electrode 606a only, and not with the remaining input electrodes 606b.

The input circuit 620 scan across the input electrodes 606, placing the driving voltage source 610 in electrical communication with each input electrode 606 sequentially.

The selected input electrode 606a and the output electrode 608 define the selected node 602a at the intersection of the input electrode 606 and the selected output electrode 608a. Since there is only a single output electrode 608, the output electrode 608 is also effectively the selected output electrode 606a. The selected node 602a receives the driving voltage from the driving voltage source 610. The resistance of the measurement array 604 at the selected node 602a results in the output current, which is provided to the transimpedance amplifier 640 for conversion and amplification to the output voltage, which is processed by the to the processor 680.

The integrator and control circuit 660 increases the sensitivity of the system 600 to changes in the property at the selected node 602a. The increased sensitivity may provide advantages in applications where maximizing measurement resolution is a primary goal, and where the importance of resolution outweighs the importance of high scanning speeds. The integrator and control circuit 660 also increases the range of signals that can be read. The integrator and control circuit 660 does not present any cutoff voltage or other signal below which signals will not be registered. The converted and amplified output voltage may then be relayed to the processor 680 including an onboard analog-to-digital converter for further processing.

In the preceding description, for purposes of explanation, numerous details are set forth in order to provide a thorough understanding of the embodiments. However, it will be apparent to one skilled in the art that these specific details are not required. In other instances, well-known electrical structures and circuits are shown in block diagram form in order not to obscure the understanding. For example, specific details are not provided as to whether the embodiments described herein are implemented as a software routine, hardware circuit or firmware.

Embodiments of the disclosure can be represented as a computer program product stored in a machine-readable medium (also referred to as a computer-readable medium, a processor-readable medium, or a computer usable medium having a computer-readable program code embodied therein). The machine-readable medium can be any suitable tangible, non-transitory medium, including magnetic, optical, or electrical storage medium including a diskette, compact disk read only memory (CD-ROM), memory device (volatile or non-volatile), or similar storage mechanism. The machine-readable medium can contain various sets of instructions, code sequences, configuration information, or other data, which, when executed, cause a processor to perform steps in a method according to an embodiment of the disclosure. Those of ordinary skill in the art will appreciate that other instructions and operations necessary to implement the described implementations can also be stored on the machine-readable medium. The instructions stored on the machine-readable medium can be executed by a processor or other suitable processing device, and can interface with circuitry to perform the described tasks.

The above-described embodiments are intended to be examples only. Alterations, modifications and variations can be effected to the particular embodiments by those of skill in the art. The scope of the claims should not be limited by the particular embodiments set forth herein, but should be construed in a manner consistent with the specification as a whole.

The invention claimed is:

1. A method of measuring resistance comprising:
   providing an array of two or more nodes, each of the nodes defined at an intersection of an input electrode and an output electrode;
   selecting a selected node at an intersection of a selected input electrode and a selected output electrode, the selected node comprising an electrical component having a resistive property;
   grounding remaining input electrodes other than the selected input electrode;
   grounding remaining output electrodes other than the selected output electrode;
   applying a driving voltage to the selected input electrode;
   converting the driving voltage to an output current through a resistance of the electrical component;
   receiving the output current at the selected output electrode;
   converting the output current to an output voltage for measuring the resistance of the electrical component; and
   calibrating the array against a pair of calibration nodes comprising an open node and a known resistance node to calculate the gain of the array.

2. The method of claim 1 wherein the two or more nodes comprise another open node.

3. The method of claim 1 wherein grounding the remaining input electrodes and the remaining output electrodes comprises establishing electrical communication between the remaining input electrodes, the remaining output electrodes and a single shared true ground, a single shared positive virtual input ground or a single shared stable fixed voltage.

4. The method of claim 1 wherein converting the output current to an output voltage comprises application of a transimpedance amplifier, or an integration and control circuit, to the output current.

5. The method of claim 1 wherein the resistance of the electrical component is variable and dependent on a first property of an environment around the electrical component, and the method further comprises determining a value of the first property at the selected node with reference to the resistance of the electrical component.

6. The method of claim 5 wherein the resistance of the electrical component is variable and dependent on a second property of the environment around the selected node, and the method further comprises determining a value of the second property at the selected node with reference to the resistance at the selected node.

7. The method of claim 6 wherein the first property and the second property are each selected from pressure, stress, shear, strain, biometrics, temperature, sound intensity or quality, light intensity or quality, electromagnetic fields, humidity, moisture, voltage, current, heart rate or other organ function, atrial fibrillation, breathing or physical movement.

8. The method of claim 1 further comprising lowering an equivalent resistance of the selected node for linearizing the output voltage.

9. A system for measuring resistance, the system comprising:
   at least three electrodes arranged in an array, the electrodes comprising at least one input electrode and at least one output electrode, and the array comprising at least two nodes, each node being defined at an intersection between an input electrode and an output electrode;
   a driving voltage source in electrical communication with the input electrode for providing a driving voltage to a selected node defined at an intersection between a selected input electrode and a selected output electrode, the selected node comprising an electrical component having a resistive property;
   a switching system in operative communication with the electrodes for selecting the selected node;
   a current-to-voltage converter circuit in electrical communication with the output electrode for receiving an output current from the selected node and converting the output current to an output voltage;
   a ground in communication with the array for grounding remaining input electrodes other than the selected input electrode, and for grounding remaining output electrodes other than the selected output electrode, for isolating the selected node from electrical effects on the array other than at the selected node; and
   a calibrator in electrical communication with the electrodes for calibrating the array against a pair of calibration nodes comprising an open node and a known resistance node.

10. The system of claim 9 wherein:
    the at least three electrodes comprise at least two input electrodes;
    the switching system is in operative communication with the at least two input electrodes;
    the system further comprises an input multiplexor in communication with the input electrodes for establishing electrical communication between the selected input electrode and the driving signal source, and between the remaining input electrodes and the ground;

the at least three electrodes comprise at least two output electrodes;

the switching system is in operative communication with the at least two output electrodes; and the system further comprises an output multiplexor in communication with the output electrodes for establishing electrical communication between the selected output electrode and the current-to-voltage converter circuit, and between the remaining output electrodes and the ground.

11. The system of claim 9 wherein a resistance at the selected node is variable and dependent on a first property or a second property of an environment around the array.

12. The system of claim 11 wherein the first property and the second property are each selected from the properties consisting of pressure, stress, shear, strain, biometrics, temperature, sound intensity or quality, light intensity or quality, electromagnetic fields, humidity, moisture, voltage, current, heart rate or other organ function, atrial fibrillation, breathing or physical movement.

13. The system of claim 9 wherein the at least two nodes comprise another open node.

14. The system of claim 9 wherein the driving voltage source comprises a DC voltage source.

15. The system of claim 9 wherein the current-to-voltage converter circuit comprises a transimpedance amplifier; or an integrator and control circuit.

16. The system of claim 9 wherein the ground comprises a true ground, a virtual ground or a stable fixed voltage.

17. The system of claim 9, further comprising an analog-to-digital converter in electronic communication with the current-to-voltage converter circuit for receiving the output voltage and converting the output voltage to a digital signal; and a processor in electronic communication with the analog-to-digital converter for receiving the digital signal and processing the digital signal.

18. The system of claim 9 further comprising a linearization circuit in electrical communication with the electrodes for lowering the equivalent resistance of the selected node for linearizing the output voltage.

* * * * *